United States Patent [19]
Hata et al.

[11] Patent Number: 4,948,627
[45] Date of Patent: Aug. 14, 1990

[54] PROCESS FOR PRODUCING GLASS MOLD

[75] Inventors: Chiemi Hata, Akishima; Shinichiro Hirota, Hachioji; Hiroyuki Sawada, Akishima, all of Japan

[73] Assignee: Hoya Corporation, Tokyo, Japan

[21] Appl. No.: 353,546

[22] Filed: May 18, 1989

[30] Foreign Application Priority Data

May 31, 1988 [JP] Japan .................................. 63-133930

[51] Int. Cl.$^5$ .............................................. B05D 3/06
[52] U.S. Cl. ........................................ 427/38; 427/57; 427/299
[58] Field of Search .................... 427/38, 57, 299, 307, 427/309; 428/408

[56] References Cited

U.S. PATENT DOCUMENTS 4,816,291 3/1989 Desphandey et al. ................ 427/38

FOREIGN PATENT DOCUMENTS 63-206390 8/1988 Japan ...................................... 427/38

OTHER PUBLICATIONS

Aisenberg et al., Use of Ion-Beam Deposited Diamond-Like Carbon for Improved Optical Elements, 1980.

*Primary Examiner*—Stanley Silverman
*Attorney, Agent, or Firm*—Nixon & Vanderhye

[57] ABSTRACT

The process for producing a glass mold according to the present invention comprises forming, on a glass mold base, a thin film consisting of diamond crystallites, graphite crystallites and amorphous carbon and having a maximum surface roughness of 200 Å or below, by a plasma CVD method or a thermal CVD method using a mixed gas comprising an organic gas and hydrogen gas, the concentration of the organic gas in the mixed gas being at least 3 mole %.

The glass mold obtained according to the present process has advantages of having excellent releasability of molded glass article after press molding, excellent durability and a long life.

10 Claims, 3 Drawing Sheets

PROCESS FOR PRODUCING GLASS MOLD

BACKGROUND OF THE INVENTION

(1) Field of the Invention

The present invention relates to a process for producing a glass mold. More particularly, the present invention relates to a process for producing a glass mold with which a molded glass article of high precision requiring no post-operation (e.g. polishing) can be obtained by press molding.

(2) Prior Art

Molds used for producing, by press molding, a molded glass article of high precision requiring no polishing must be chemically inactive to a glass to be molded at high temperatures, and must not invite adhesion of glass to the mold after press molding, because the press molding is ordinarily effected at high temperatures such as 300–700° C. though the molding temperature differs by the composition of the glass to be molded. Also, materials for a base for glass molds are required to be processable to an optically high precision surface, to withstand impact applied during press molding and to cause no thermal deformation, and thus must have sufficient heat resistance, sufficient thermal shock resistance and sufficient mechanical strength.

As the materials for glass mold, there have conventionally been used WC (tungsten carbide), a WC-Co alloy and various cermets. These materials, however, have a drawback of causing surface roughening by oxidation at high temperatures. As a material for glass mold which causes no surface roughening at high temperatures and which can be processed into a mold having a mirror surface, there can be mentioned one having thereon a $\beta$-SiC film formed by a CVD method. Even this material, however, has a drawback in that the mold produced therefrom invites adhesion of glass thereto when glass is press-molded in the mold at high temperatures of 400° C. or above.

As a means for preventing adhesion of glass to the mold, it is known to form a releasing film of carbon on the surface of a mold. As the releasing film of carbon, a diamond film and a diamond-like carbon film (hereinafter referred to as i-carbon film, in some cases) are disclosed in Japanese Patent Application Kokai Nos. 281030/1986 and 183134/1986. However, each of these films has the following problems.

For example, in the case of the diamond film, which is clearly shown to be polycrystalline diamond by means of Raman spectroscopy and SEM observation, the film cannot be obtained so as to have a smooth surface and, in order to produce therefrom a glass mold with an optically good surface precision, polishing is necessary. However, since the diamond film per se is very hard, the polishing is very difficult and accordingly the mold obtained is very expensive and impractical to produce. In the case of the glass mold with a diamond-like carbon film (an i-carbon film), when a glass is hot-pressed in the mold at 500–700° C. (even if it is effected in a $H_2$ gas atmosphere), the diamond-like carbon film which inherently has poor heat resistance and durability suffers from deterioration in properties with the lapse of time, and the diamond-like carbon film peels off.

As described in detail above, the conventional diamond film and diamond-like carbon film used as a releasing film for a glass mold, are not satisfactory in formation of an optical mirror surface on a mold base, heat resistance, durability, adhesivity to the mold base, productivity (economy), etc.

SUMMARY OF THE INVENTION

Therefore, an object of the present invention is to provide a process for producing a glass mold with a releasing film satisfying all of the above-mentioned requirements.

Other object will be apparent from the following descriptions and drawings.

According to the present invention, there is provided a process for producing a glass mold, which comprises forming, on a glass mold base having a shape corresponding to that of the glass article to be produced by press molding, a thin film consisting of diamond crystallites, graphite crystallites and amorphous carbon and having a maximum surface roughness of 200 Å or below, by a plasma CVD method or a thermal CVD method using a mixed gas comprising an organic gas and hydrogen gas, the concentration of the organic gas in the mixed gas being at least 3 mole %.

DETAILED DESCRIPTION OF THE INVENTION

Figure 1:
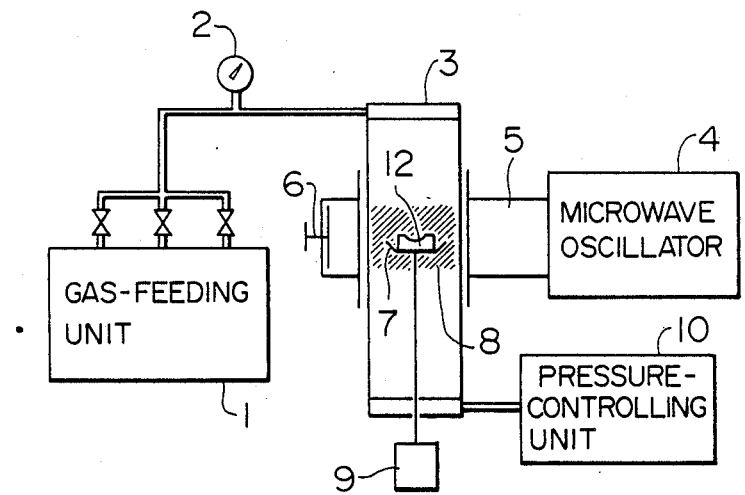
FIG. 1 is a schematic drawing showing a microwave plasma CVD apparatus suitable for effecting the process of the present invention.

The present invention is described in detail below.

In the present invention, as a material for the glass mold base which has a shape corresponding to that of a glass article to be produced by press molding and on which a thin film is to be formed, there can be used SiC (sintered), Si, $Si_3N_4$, $ZrO_2$, TiN, $TiO_2$, TiC, $B_4C$, WC, W, a WC-Co alloy and various cermets. The use of sintered SiC having thereon a $\beta$-SiC film formed by a CVD method is preferred especially.

In the present invention, the formation of a thin film on the glass mold base can be effected by a plasma CVD method or a thermal CVD method. The plasma CVD method includes a microwave plasma CVD method, a rf (radio-frequency) plasma CVD method, a DC (direct current) plasma CVD method, etc. The thermal CVD method includes a hot filament CVD method, an EA (electron-assisted) hot filament CVD method, etc.

In the present invention, in the formation of a thin film by the above plasma CVD or thermal CVD method, there is used, as a feed gas, a mixed gas comprising an organic gas and hydrogen gas, the concentration of the organic gas in the mixed gas being at least 3 mole %. As the organic gas used in the feed gas in an amount of at least 3 mole %, methane is most preferred. In using methane, the concentration in feed gas is preferably 4–50 mole %. Besides methane, there can also be used other hydrocarbon gases such as ethane, ethylene, acetylene and the like. When these hydrocarbon gases are used, their concentration in feed gas is preferably 30 mole % or less. There can also be used, for example, aliphatic alcohols such as methanol, ethanol and the like in vapor form, and their concentration in feed gas is preferably 70 mole % or less. In using the aliphatic alcohols in vapor form, the lower limit of concentration in feed gas is preferably higher than 3 mole % (e.g. 8 mole % or higher). When the concentration of the organic gas in the feed gas is less than 3 mole %, the automorphic form of diamond appears in the thin film formed, whereby polishing becomes necessary and the adhesivity of the film to the mold base is reduced. This is the reason for restricting the organic gas concentration to at least 3 mole %. When the concentrations of methane, other hydrocarbons and aliphatic alcohols in vapor form exceed 50 mole %, 30 mole % and 70 mole %, respectively, the content of amorphous carbon in the thin film formed increases, inviting deterioration in durability and weathering resistance of said film.

The feed gas can contain water vapor in addition to the organic gas and hydrogen gas. When the feed gas contains water vapor, it is necessary to increase the concentration of carbon atoms in the feed gas by 10-30% compared with the non-use of water vapor.

The process of the present invention is effected preferably by a plasma CVD method. When the thin film formation is effected by, for example, a microwave plasma CVD method using, as the feed gas, methane gas and hydrogen gas, the desired conditions are as follows.

Flow rate of feed gas 50-500 CCM (cc/min), especially preferably 100-200 CCM

Concentration of methane $[CH_4/(CH_4+H_2)]$ 3-50 mole %, especially preferably 5-20 mole %

Pressure of feed gas $10^{-2}$-600 Torr, especially preferably 1-200 Torr

Electric power for microwave 200-1,000 W, especially preferably 300-700 W

Temperature of mold 700-1,100° C., especially preferably 800-950° C. (with employing no auxiliary heating)

An apparatus for microwave plasma CVD used for forming a thin film on a glass mold base under the above conditions is shown in FIG. 1.

In FIG. 1, as a mold base 12, there was used a mold base obtained by, after precise machining into a desired shape, subjecting to a pretreatment by applying an ultrasonic wave (200 W or larger) in a slurry of a diamond powder (5-30 μm) dispersed in an organic solvent (alcohol or acetone) (the density of diamond nuclei generated on the mold base $=10^9$-$10^{10}$ nuclei/cm$^2$). This mold base 12 is placed on a holder 7. With a feed gas being supplied into a reaction chamber 3 from a gas-feeding unit 1, a pressure-controlling unit 10 is actuated, whereby the pressure inside the reaction chamber 3 is controlled to a desired level. Incidentally, the numeral 2 shows a vacuum meter for pressure measurement. A microwave is produced by a microwave oscillator 4 and is introduced into the reaction chamber 3 through a waveguide 5 to generate a plasma in a region 8 of the reaction chamber 3 and thereby to form a thin film on the mold base 12. Incidentally, the numeral 6 shows a plunger (a reflection plate) for adjusting the position of the plasma region 8.

The plasma tends to concentrate at, for example, the edge of the mold base 12, which invites a nonuniform temperature distribution in the base 12.

Figure 2:
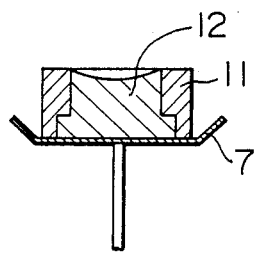
FIG. 2 is a drawing showing a mold base-holding portion of the apparatus of FIG. 1.

In order to prevent it, it is preferable that the circumference of the mold base 12 be surrounded by a cover 11 of high purity glassy carbon or graphite, as shown in FIG. 2. By providing the cover 11 and rotating the holder 7 by a turning mechanism 9, it is possible to form a uniform thin film on the very surface of the mold base which is to be subjected to press molding after the film formation. By subjecting the mold base 12 to film formation under the above conditions for a period of 5 hours or less, preferably 20 minutes to 2 hours, there can be obtained a dense and smooth thin film having a maximum surface roughness of 200 Å or below. This thin film has a film thickness of 1 μm or below.

Figure 3:
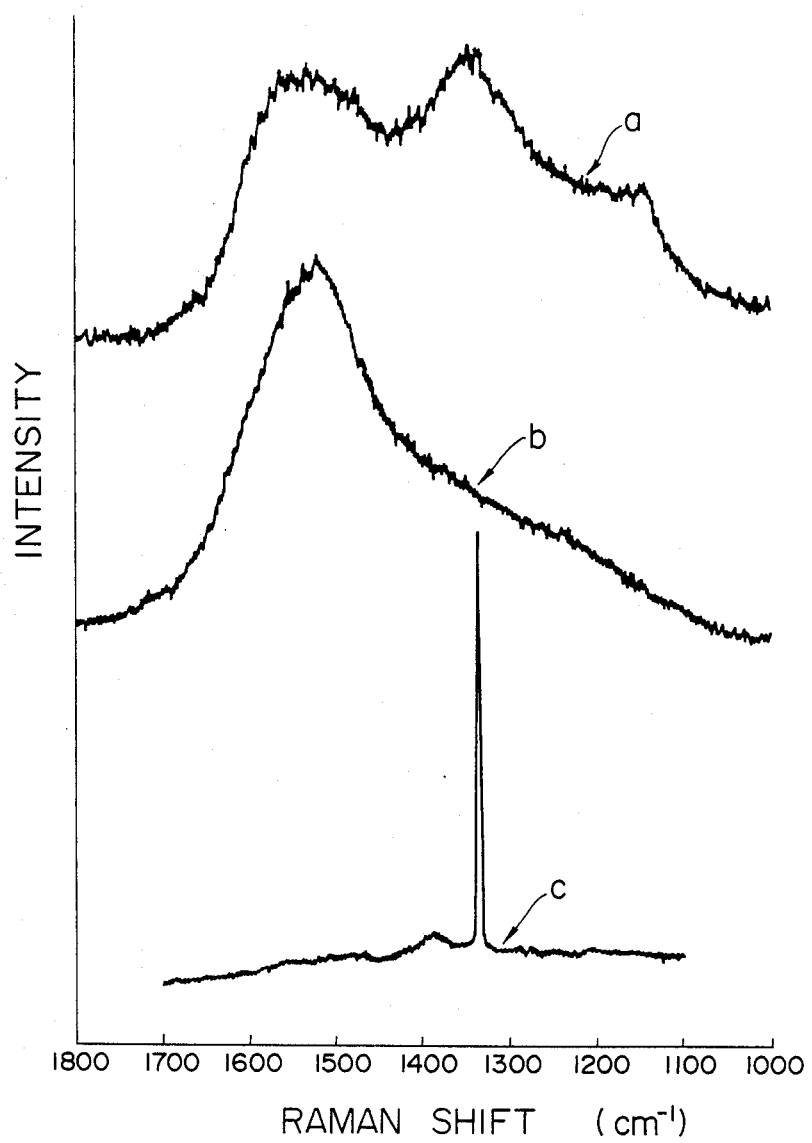
FIG. 3 is a Raman spectrum of a thin film formed according to the process of the present invention.
Figure 4:
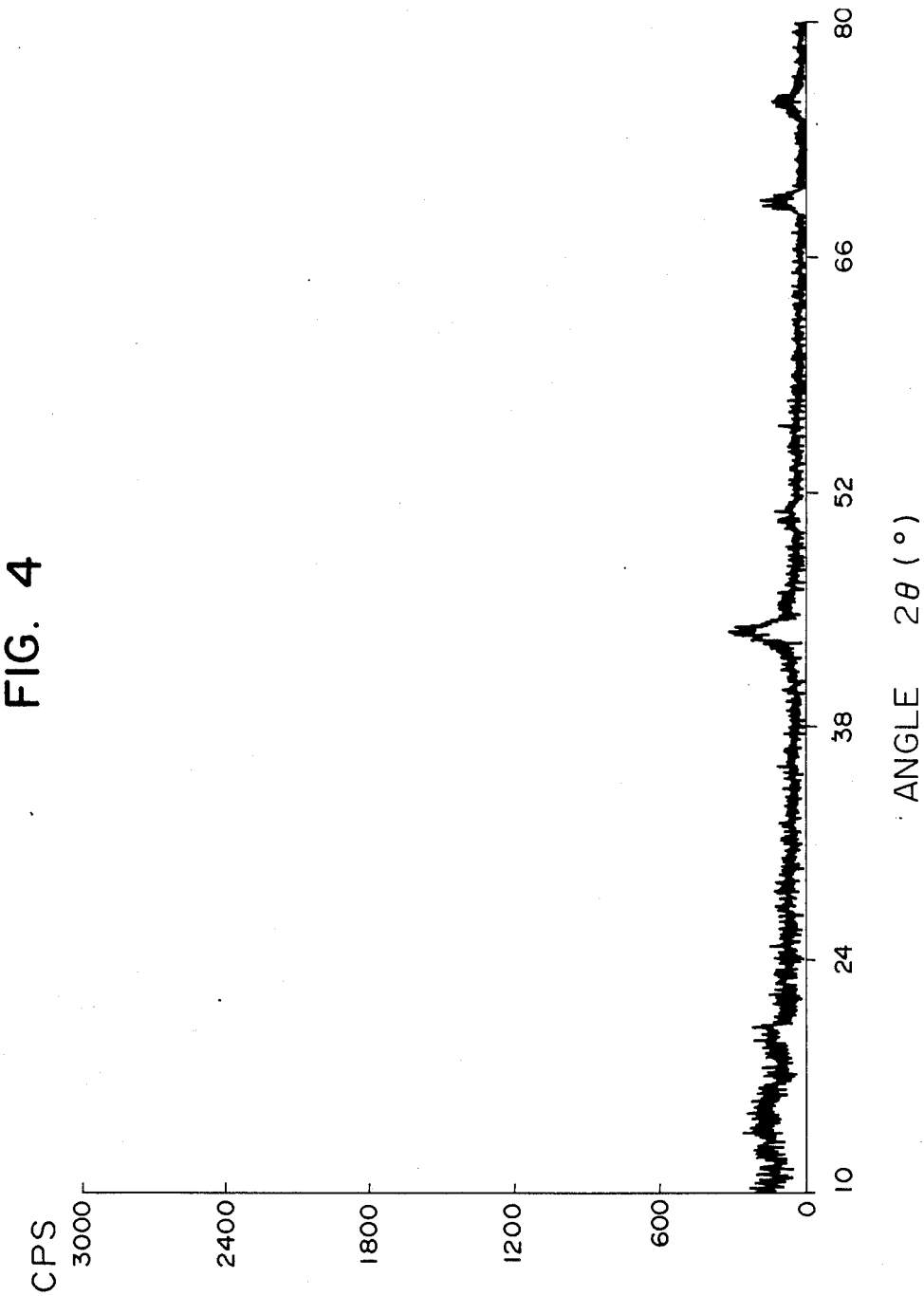
FIG. 4 is an X-ray diffraction pattern of the above thin film.

The Raman spectrum of the thin film obtained according to the present process, as shown in FIG. 3a, characteristically shows a Raman line due to a double bond carbon at about 1,550 cm$^{-1}$, a Raman line due to random graphite crystallites at about 1,360 cm$^{-1}$ and a Raman line due to a polyene structure at about 1,150 cm$^{-1}$. For comparison, the Raman spectra of an i-carbon film and a diamond film are shown in FIGS. 3b and 3c, respectively. It is obvious in FIGS. 3a, 3b and 3c that the thin film obtained according to the present process is largely different in its Raman spectrum from the i-carbon film and the diamond film. While in FIG. 3a the Raman line due to diamond at about 1,333 cm$^{-1}$ is hardly seen, the X-ray diffraction pattern of FIG. 4 for the same thin film obtained according to the present process clearly shows a diffraction line due to diamond crystallites at $2\theta=44°$; therefore, the thin film formed according to the present process can be identified to be a mixture of diamond crystallites, graphite crystallites and amorphous carbon.

The thin film formed on the mold base and consisting of a mixture of diamond crystallites, graphite crystallites and amorphous carbon has a maximum surface roughness of 200 Å or below and accordingly has excellent surface smoothness and moreover has excellent adhesivity to the mold base. Therefore, the film is very suitable as a releasing film.

In the above, the present process for producing a glass mold has been explained with reference to using a microwave plasma CVD method. The use of another plasma CVD method or a thermal CVD method can also produce a thin film consisting of a mixture of diamond crystallites, graphite crystallites and amorphous carbon and having excellent surface smoothness and excellent adhesivity to the mold base. The conditions of the other plasma CVD method or the thermal CVD method are substantially the same as those of the above microwave plasma CVD method and can be determined appropriately.

The process for producing a glass mold according to the present invention is explained in more detail below by way of the following Examples.

EXAMPLE 1

As a base for the mold, there was used a mold base obtained by forming, by a CVD method, a β-SiC film having a (111) plane orientation, on sintered SiC having a shape corresponding to that of the glass article to be produced by press molding. To the surface of the mold base was applied an ultrasonic wave for 2 hours in a dispersion of a diamond powder of 10-20 μm in ethanol to effect a treatment for increasing the density of the nuclei generated. The resulting mold base 12 was placed on a given holder 7 in a microwave plasma CVD apparatus of FIG. 1 mentioned previously. The reaction chamber 3 was subjected to preliminary degassing to $10^{-5}$ Torr or below. Then, methane gas and hydrogen gas were introduced into the reaction chamber 3 at a total gas flow rate of 100 CCM by controlling the methane gas concentration $[CH_4/(CH_4+H_2)]$ at a constant level of 8.0 mole % and the pressure inside the chamber 3 was made constant to 40 Torr by degassing. Thereafter, a microwave was introduced into the reaction chamber 3 through a waveguide 5 to generate a plasma. The microwave power was controlled at 500 W. At this time, the temperature of the mold base 12 was constant at 870° C. A reaction was effected for 45 minutes under the above conditions to form on the mold base 12 a thin film consisting of diamond crystallites, graphite crystallites and amorphous carbon. The formed thin film had a film thickness of 2,000 Å and a maximum surface roughness of 30 Å. Using the thus obtained glass mold, BK 7 glass (borosilicate glass, Tg=565° C., Ts=625° C.) was press-molded 10,000 times at a press temperature of 645° C. in a $N_2$ gas atmosphere. On the surface of the glass mold after press molding, there was observed neither film peeling nor cracking. Further, the molded glass article had a maximum surface roughness of 30 Å or below and accordingly good surface smoothness.

EXAMPLE 2

There was used the same mold base as in Example 1, to which the same ultrasonic wave treatment as in Example 1 had been applied. As the apparatus, the same microwave plasma CVD apparatus as in Example 1 was used. Under the conditions of a total gas flow rate of 150 CCM and a methane gas concentration $[CH_4/(CH_4+H_2)]$ of 15 mole %, about 0.5 CCM of water vapor (vapor pressure=20 Torr at 25° C.) was introduced with $H_2$ used as a carrier gas. The pressure inside the reaction chamber was controlled at 40 Torr and the microwave power was controlled at 550 W. At this time, the temperature of the mold base was 900° C. A reaction was effected for 1 hour under these conditions to form on the mold base a thin film consisting of diamond crystallites, graphite crystallites and amorphous carbon having a film thickness of 5,000 Å and a maximum surface roughness of 100 Å. Using the thus obtained glass mold, BK 7 glass was press-molded 10,000 times at a press temperature of 645° C. in a $N_2$ gas atmosphere. On the surface of the glass mold after press molding, there was observed neither film peeling nor cracking. Further, the molded glass article had a maximum surface roughness of 100 Å or below and accordingly good surface smoothness.

EXAMPLE 3

There was used the same mold base as in Examples 1 and 2, to which the same ultrasonic wave treatment as in Examples 1 and 2 had been applied, but unlike Examples 1 and 2, a rf plasma CVD apparatus was used. Under the conditions of a total gas flow rate of 100 CCM, a gas pressure of 40 Torr, a methane gas concentration $[CH_4/(CH_4+H_2)]$ of 10 mole % and a rf power of 500 W, a reaction was effected for 45 minutes to form on the mold base a thin film consisting of diamond crystallites, graphite crystallites and amorphous carbon and having a film thickness of 2,500 Å and a maximum surface roughness of 50 Å.

Using the thus obtained glass mold, BK 7 glass was press-molded 10,000 times at a press temperature of 645° C. in a $N_2$ gas atmosphere. There was observed no deterioration on the surface of the mold after press molding. Further, the molded glass article had a maximum surface roughness of 50 Å or below and accordingly had good surface smoothness.

EXAMPLE 4

The same mold base as in Example 1 was used. It was subjected to a polishing treatment for 20 minutes using a diamond powder of 2–4 μm and a nylon buff, to effect a treatment for increasing the density of nuclei generated.

Then, the resulting mold base was subjected to a reaction for 30 minutes, using a microwave plasma CVD apparatus of FIG. 1 and a feed gas consisting of ethanol gas and hydrogen gas, under the conditions of a total gas flow rate of 100 CCM, an ethanol gas concentration $[C_2H_5OH/(C_2H_5OH+H_2)]$ of 20 mole %, a vacuum of 40 Torr, a microwave power of 500 W and a mold base temperature of 870° C., whereby a thin film consisting of diamond crystallites, graphite crystallites and amorphous carbon was formed on the mold base. The thin film had a film thickness of 2,000 Å and a maximum surface roughness of 40 Å. Using the thus obtained mold, BK 7 glass was press-molded 10,000 times at a press temperature of 645° C. in a $N_2$ gas atmosphere. There was observed no deterioration on the surface of the glass mold after press molding. Further, the molded glass article had a maximum surface roughness of 40 Å or below and accordingly good surface smoothness.

EXAMPLE 5

The procedure of Example 1 was repeated except that the ultrasonic wave treatment was effected for 3 hours and the methane concentration $[CH_4/(CH_4+H_2)]$ was changed to 40 mole %, to form on a mold base a thin film consisting of diamond crystallites, graphite crystallites and amorphous carbon. The thin film had a film thickness of 4,000 Å and a maximum surface roughness of 180 Å.

Using the resulting mold, BK 7 glass was press-molded in the same manner as in Example 1. On the surface of the mold, there was observed neither film peeling nor cracking even after 7,000 times of press molding. Further, the molded glass article had a maximum surface roughness of 180 Å or below and accordingly good surface smoothness.

EXAMPLE 6

The procedure of Example 1 was repeated except that the ultrasonic wave treatment was effected for 3 hours, ethane was substituted for methane and the ethane gas concentration $[C_2H_6/(C_2H_6+H_2)]$ was 25 mole %, and the film formation time was 30 minutes, to form on a mold base a thin film consisting of diamond crystallites, graphite crystallites and amorphous carbon. The thin film had a film thickness of 2,000 Å and a maximum surface roughness of 120 Å.

Using the glass mold obtained, BK 7 glass was press-molded in the same manner as in Example 1. Even after 10,000 times of press molding, there was observed neither film peeling nor cracking on the surface of the mold. Further, the molded glass article had a maximum surface roughness of 120 Å or below and accordingly good surface smoothness.

EXAMPLE 7

The procedure of Example 1 was repeated except that the ultrasonic wave treatment was effected for 3 hours, ethylene was substituted for methane and the ethylene gas concentration [$C_2H_4/(C_2H_4+H_2)$] was 10 mole %, and the film formation time was 40 minutes, to form on a mold base a thin film consisting of diamond crystallites, graphite crystallites and amorphous carbon. The thin film had a film thickness of 2,500 Å and a maximum surface roughness of 80 Å.

Using the glass mold obtained, BK 7 glass was press-molded in the same manner as in Example 1. Even after 10,000 times of press molding, there was observed neither film peeling nor cracking on the surface of the mold. Further, the molded glass article had a maximum surface roughness of 80 Å or below and accordingly good surface smoothness.

EXAMPLE 8

The procedure of Example 1 was repeated except that the ultrasonic wave treatment was effected for 3 hours, methanol was substituted for methane and the methanol gas concentration [$CH_3OH/(CH_3OH+H_2)$] was 70 mole %, to form on a mold base a thin film consisting of diamond crystallites, graphite crystallites and amorphous carbon. The thin film had a film thickness of 3,500 Å and a maximum surface roughness of 220 Å.

Using the mold obtained, BK 7 glass was press-molded in the same manner as in Example 1. Even after 5,000 times of press molding, there was observed neither film peeling nor cracking on the surface of the mold. Further, the molded glass article had a maximum surface roughness of 200 Å or below and accordingly good surface smoothness.

EXAMPLE 9

The procedure of Example 1 was repeated except that the ultrasonic wave treatment was effected for 3 hours, ethanol was substituted for methane and the ethanol gas concentration [$C_2H_5OH/(C_2H_5OH+H_2)$] was 50 mole %, to form on a mold base a thin film consisting of diamond crystallites, graphite crystallites and amorphous carbon. The thin film had a film thickness of 3,000 Å and a maximum surface roughness of 200 Å.

Using the mold obtained, BK 7 glass was press-molded in the same manner as in Example 1. Even after 5,000 times of press molding, there was observed neither film peeling nor cracking on the surface of the mold. Further, the molded glass article had a maximum surface roughness of 200 Å or below and accordingly good surface smoothness.

COMPARATIVE EXAMPLE 1

The procedure of Example 1 was repeated except that the methane gas concentration [$CH_4/(CH_4+H_2)$] was changed to 2 mole %, to form a thin film on a mold base. The thin film had a film thickness of 1,000 Å and a maximum surface roughness of 300 Å.

Using the mold obtained, BK 7 glass was press-molded in the same manner as in Example 1. After 20 times of press molding, there were seen film peeling, cracking, etc. on the surface of the mold.

COMPARATIVE EXAMPLE 2

The procedure of Example 1 was repeated except that the methane gas concentration [$CH_4/(CH_4+H_2)$] was changed to 80 mole %, to form a thin film on a mold base. The thin film had a film thickness of 5,000 Å and a maximum surface roughness of 250 Å.

Using the mold obtained, BK 7 glass was press-molded in the same manner as in Example 1. After 1,000 times of press molding, the thin film disappeared owing to its oxidation.

As explained above, according to the present process for producing a glass mold, there can be obtained a glass mold which causes neither film peeling nor cracking even after repeated press molding over a long period of time and accordingly has very high durability and a long life. The mold is prepared by forming, on the surface of a specific mold base, a thin film consisting of diamond crystallites, graphite crystallites and amorphous carbon and having a maximum surface roughness of 200 Å or below by means of a plasma CVD method or a thermal CVD method. Further, using this mold, there can be obtained, by press-molding, a good glass article which is very easily releasable from the thin film of the mold and which has a maximum surface roughness about same as that of the mold.

The use of the glass mold obtained according to the present process has brought about significant productivity increase and cost reduction.

What is claimed is:

1. A process for producing a glass mold, which comprises forming, on a glass mold base having a shape corresponding to that of a glass article to be produced by press molding, a thin film consisting of diamond crystallites, graphite crystallites and amorphous carbon and having a maximum surface roughness of 200 Å or below, by a plasma CVD method or a thermal CVD method using a mixed gas comprising an organic gas and hydrogen gas, the concentration of the organic gas in the mixed gas being at least 3 mole %.

2. A process according to claim 1, wherein the material of the glass mold base is one member selected from the group consisting of SiC (sintered), Si, $Si_3N_4$, $ZrO_2$, TiN, $TiO_2$, TiC, $B_4C$, WC, W, a WC-Co alloy and cermets.

3. A process according to claim 2, wherein the sintered SiC as the material of the glass mold base has thereon a $\beta$-SiC film formed by a CVD method.

4. A process accoridng to claim 1, wherein the glass mold base is subjected, before the formation of a thin film thereon, to a pretreatment of applying an ultrasonic wave to the base in a slurry obtained by dispersing a diamond powder in an organic solvent.

5. A process according to claim 1, wherein the glass mold base is subjected, before the formation of a thin film thereon, to a polishing treatment using a diamond powder and a nylon buff to increase the density of nuclei generated.

6. A process according to claim 1, wherein the organic gas is methane and is contained in the mixed gas in a concentration of 4–50 mole %.

7. A process according to claim 1, wherein the organic gas is at least one hydrocarbon gas selected from ethane, ethylene and acetylene and is contained in the mixed gas in a concentration of 30 mole % or less.

8. A process according to claim 1, wherein the organic gas is an aliphatic alcohol vapor and is contained in the mixed gas in a concentration of 70 mole % or less.

9. A process according to claim 1, wherein the mixed gas further contains water vapor.

10. A process according to claim 1, wherein the thin film has a film thickness of 1 μm or less.

* * * * *